(12) United States Patent
Hikosaka (10) Patent No.: US 11,402,275 B2
(45) Date of Patent: Aug. 2, 2022

(54) SENSOR APPARATUS

(71) Applicant: DENSO CORPORATION, Kariya (JP)

(72) Inventor: Shogo Hikosaka, Kariya (JP)

(73) Assignee: DENSO CORPORATION, Kariya (JP)

( * ) Notice: Subject to any disclaimer, the term of this patent is extended or adjusted under 35 U.S.C. 154(b) by 891 days.

(21) Appl. No.: 16/231,745

(22) Filed: Dec. 24, 2018

(65) Prior Publication Data

US 2019/0128747 A1 May 2, 2019

Related U.S. Application Data

(63) Continuation of application No. PCT/JP2017/019219, filed on May 23, 2017.

(30) Foreign Application Priority Data

Aug. 5, 2016 (JP) .............................. JP2016-154534

(51) Int. Cl.
| | |
|---|---|
| *G01K 7/20* | (2006.01) |
| *G01L 9/00* | (2006.01) |
| *G01L 19/04* | (2006.01) |
| *G01L 9/04* | (2006.01) |
| *G01D 3/036* | (2006.01) |
| *G01L 9/06* | (2006.01) |
| *G01R 27/14* | (2006.01) |

(52) U.S. Cl.
CPC .............. *G01K 7/20* (2013.01); *G01D 3/036* (2013.01); *G01L 9/04* (2013.01); *G01L 9/045* (2013.01); *G01L 9/065* (2013.01); *G01L 19/04* (2013.01); *G01R 27/14* (2013.01)

(58) Field of Classification Search
CPC .... G01K 7/20; G01L 9/00; G01L 9/04; G01L 9/045; G01L 9/06; G01L 9/065; G01L 19/04; G01D 3/036; G01R 27/14
See application file for complete search history.

(56) References Cited

U.S. PATENT DOCUMENTS

| | | | | |
|---|---|---|---|---|
| 5,419,199 A | * | 5/1995 | Araki ..................... | G01L 9/065 73/862.623 |
| 5,777,235 A | * | 7/1998 | Altwein ................. | G01G 3/147 73/769 |
| 8,701,460 B2 | | 4/2014 | Krishna et al. | |
| 10,054,502 B2 | * | 8/2018 | Nezuka ................... | G01L 9/045 |
| 2016/0209287 A1 | | 7/2016 | Hirayama | |

FOREIGN PATENT DOCUMENTS

| | | | | |
|---|---|---|---|---|
| DE | 10133525 B4 | * | 8/2010 | ........... G01L 1/2268 |
| EP | 0 709 660 A1 | | 5/1996 | |
| JP | 2898500 B2 | | 6/1999 | |
| JP | 3520652 B2 | | 4/2004 | |
| JP | 2006-078310 A | | 3/2006 | |
| WO | WO-2006020814 A2 | * | 2/2006 | ............. G01D 21/02 |

\* cited by examiner

*Primary Examiner* — Nguyen Q. Ha
(74) *Attorney, Agent, or Firm* — Posz Law Group, PLC (57) ABSTRACT

A sensor apparatus includes: a sensor that includes a resistor bridge circuit; a temperature detection circuit that provides a first path and a second path; a voltage measurement portion that measures a voltage of each of the differential output terminals; a controller that causes the voltage measurement portion to measure the voltage of each of the two differential output terminals; and a calculator that calculates a difference between the voltages of the two differential output terminals to acquire temperature information of the sensor.

8 Claims, 13 Drawing Sheets

| SEQUENCE | (A) PRESSURE | (B) TEMPERATURE P | (C) TEMPERATURE M | (A) PRESSURE | (B) TEMPERATURE P | (C) TEMPERATURE M | ... |
|---|---|---|---|---|---|---|---|
| TEMPERATURE DETECTION CIRCUIT (OPERATION OF CONTROL CIRCUIT) | ALL SW_OFF | ONLY SP_ON | ONLY SM_ON | ALL SW_OFF | ONLY SP_ON | ONLY SM_ON | ... |
| ARITHMETIC PORTION | — | | | TEMPERATURE P − TEMPERATURE M | | | ... |

FIG. 5

EXAMPLE: $R_s = 10\ k$, $R_d = 20\ k$

| $\Delta R/R_s$ | ERROR [%] RELATIVE TO APPROXIMATE EXPRESSION |
|---|---|
| 0.001 | 0.000 |
| 0.005 | 0.002 |
| 0.01 | 0.008 |
| 0.05 | 0.200 |
| 0.1 | 0.802 |
| 0.2 | 3.226 |
| 0.3 | 7.332 |
| 0.4 | 13.223 |
| 0.5 | 21.053 |

| AD SEQUENCE | TEMPERATURE P | TEMPERATURE M | TEMPERATURE P | TEMPERATURE M | ... |
|---|---|---|---|---|---|
| TEMPERATURE DETECTION CIRCUIT | ONLY SP_ON | ONLY SM_ON | ONLY SP_ON | ONLY SM_ON | ... |
| ARITHMETIC PORTION | INITIAL VALUE | | TEMPERATURE P − TEMPERATURE M<br>TEMPERATURE P + TEMPERATURE M | | ... |

SENSOR APPARATUS

CROSS REFERENCE TO RELATED APPLICATIONS

The present application is a continuation application of International Patent Application No. PCT/JP2017/019219 filed on May 23, 2017, which designated the U.S. and claims the benefit of priority from Japanese Patent Application No, 2016-154534 filed on Aug. 5, 2016. The entire disclosures of all of the above application are incorporated herein by reference.

TECHNICAL FIELD

The present disclosure relates to a sensor apparatus including a sensor that includes a resistor bridge circuit.

BACKGROUND

A pressure sensor may include a resistor bridge circuit which uses a diffused resistor and have a temperature characteristic. When a pressure is detected by a pressure sensor, it may be necessary to perform a correction according to the temperature characteristic. For example, a constant current source may be connected between diagonal output terminals of a resistor bridge circuit to acquire temperature information of a pressure sensor.

SUMMARY

According to one aspect of the present disclosure, a temperature detection circuit is configured to form a first path for supplying a current to one of positive-side and negative-side differential output terminals of a sensor that includes a resistor bridge circuit and a second path for draining a current from the other differential output terminal, the first path and the second path being switchable with respect to the two differential output terminals. A controller may cause a voltage measurement portion to measure a voltage of each of the two differential output terminals. A calculator may calculate a difference between the voltages of the two differential output terminals to acquire temperature information of the sensor.

BRIEF DESCRIPTION OF DRAWINGS

The above and other objects, features, and advantages of the present disclosure will become more apparent from the following detailed description with reference to the accompanying drawings. In the drawings:

FIG. 2 is a diagram illustrating a state in which switch circuits SP1 and SP2 of a temperature detection circuit are ON;

FIG. 3 is a diagram illustrating a state in which switch circuits SM1 and SM2 of the temperature detection circuit are ON;

DETAILED DESCRIPTION

First Embodiment

Figure 1:
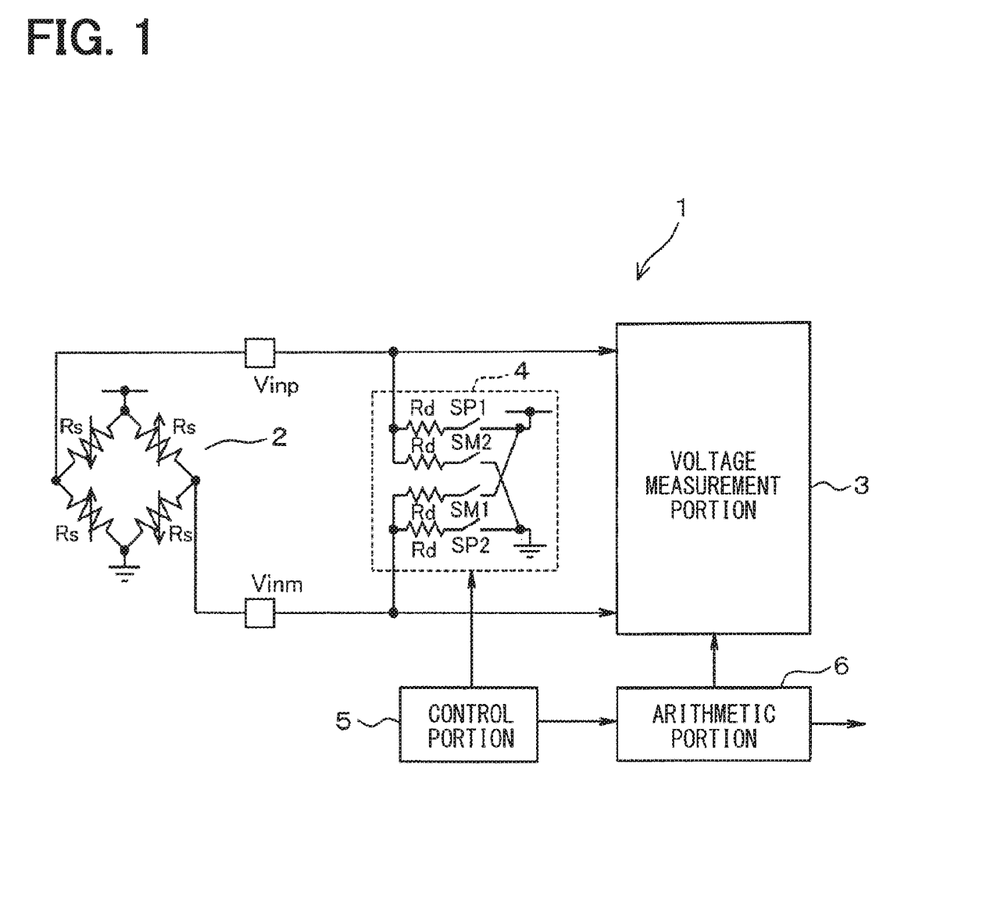
FIG. 1 is a diagram illustrating a configuration of a sensor apparatus in a first embodiment.

As illustrated in FIG. 1, a sensor apparatus 1 of the present embodiment includes a pressure sensor 2 that includes four resistor elements Rs configuring a resistor bridge circuit. In the pressure sensor 2, one pair of the opposite corners of the resistor bridge is connected between a power source and ground. Each of differential output terminals Vinp and Vinm corresponding to the other pair of the opposite corners of the resistor bridge is connected to an input terminal of a voltage measurement portion 3. The voltage measurement portion 3 measures a voltage of each of the differential output terminals Vinp and Vinm. The voltage measurement portion 3 may be referred to as a voltage measurement circuit.

A temperature detection circuit 4 is connected between the differential output terminals Vinp and Vinm. The temperature detection circuit 4 includes a series circuit which is connected between the output terminal Vinp and the power source and includes a resistor element Rd and a switch circuit SP1, and a series circuit which is connected between the output terminal Vinp and the ground and includes a resistor element Rd and a switch circuit SM2. The temperature detection circuit 4 further includes a series circuit which is connected between the output terminal Vinm and the power source and includes a resistor element Rd and a switch circuit SM1, and a series circuit which is connected between the output terminal Vinm and the ground and includes a resistor element Rd and a switch circuit SP2.

A controller 5 performs ON/OFF control for the switch circuits SP1 and SP2 as well as SM1 and SM2 of the temperature detection circuit 4. A calculator 6 performs an operation on the voltage of each of the differential output terminals Vinp and Vinm measured by the voltage measurement portion 3 to acquire information of a pressure detected by the pressure sensor 2 and temperature information for correcting the pressure. The series circuit including the switch circuit SP1 and the resistor element Rd, the series circuit including the switch circuit SP2 and the resistor element Rd, the series circuit including the switch circuit SM1 and the resistor element Rd, and the series circuit including the switch circuit SM2 and the resistor element Rd correspond to a first series circuit, a fourth series circuit, a second series circuit, and a third series circuit, respectively.

Figure 4:
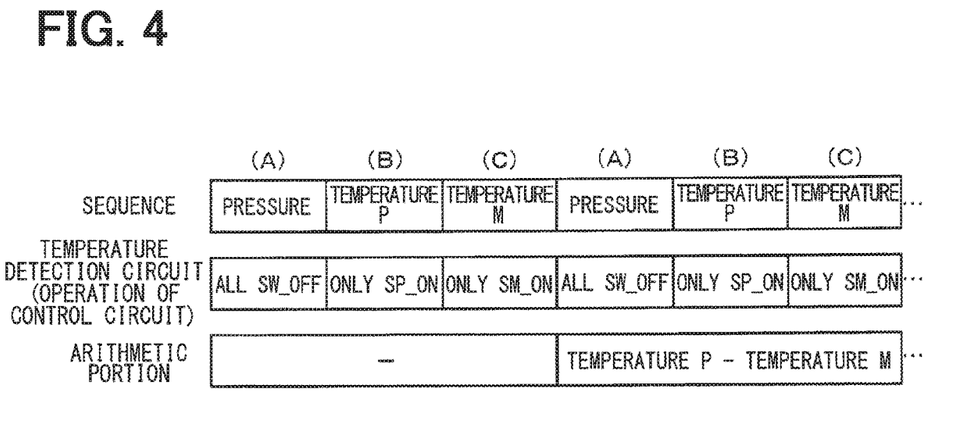
FIG. 4 is a diagram illustrating a control sequence of the sensor apparatus.

Next, an action of the present embodiment will be described. As illustrated in FIG. 4, in a phase (A), the controller 5 turns off all of the switch circuits SP1 and SP2 as well as SM1 and SM2 of the temperature detection circuit 4 to produce a state illustrated in FIG. 1. In this state, the controller 5 causes the voltage measurement portion 3 to measure a differential voltage for obtaining information of a pressure detected by the pressure sensor 2. This method is similar to a common method. The pressure information is obtained by Expression (1) by measuring the voltage of each of the differential output terminals Vinp and Vinm of the pressure sensor 2.

Pressure $(Vinp - Vinm) =$ Expression 1

$$\left(\frac{Rs + \triangle R}{2Rs} - \frac{Rs - \triangle R}{2Rs}\right) Vdd = \frac{\triangle R}{Rs} Vdd$$

Figure 2:
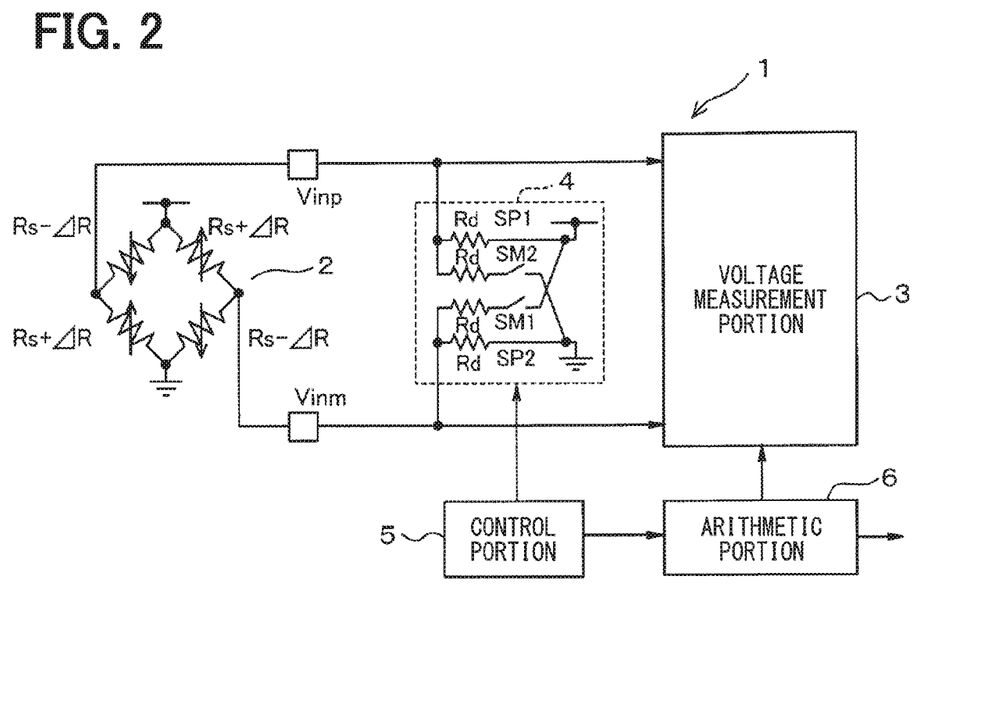

Then, in a phase (B), the controller 5 turns on the switch circuits SP1 and SP2 of the temperature detection circuit 4 and turns off the switch circuits SM1 and SN/12 of the temperature detection circuit 4 to produce a state illustrated in FIG. 2. Then, the controller 5 causes the voltage measurement portion 3 to measure a differential voltage for obtaining temperature information of the pressure sensor 2. At this time, a first path for drawing a sink current from the power source is formed on the output terminal Vinp side of the pressure sensor 2, and a second path for supplying a source current to the ground is formed on the output terminal Vinm side. A voltage measured in this state is denoted by a temperature P (Vinp−Vinm) which is expressed by expression (2).

Temperature $P(Vinp - Vinm) =$ Expression 2

$$\frac{Rs + \triangle R}{Rs + \triangle R + \frac{(Rs - \triangle R)Rd}{Rs - \triangle R + Rd}} Vdd -$$

$$\frac{1}{Rs + \triangle R + \frac{(Rs - \triangle R)Rd}{Rs - \triangle R + Rd}} * \frac{(Rs - \triangle R)Rd}{Rs - \triangle R + Rd} Vdd$$

Figure 3:
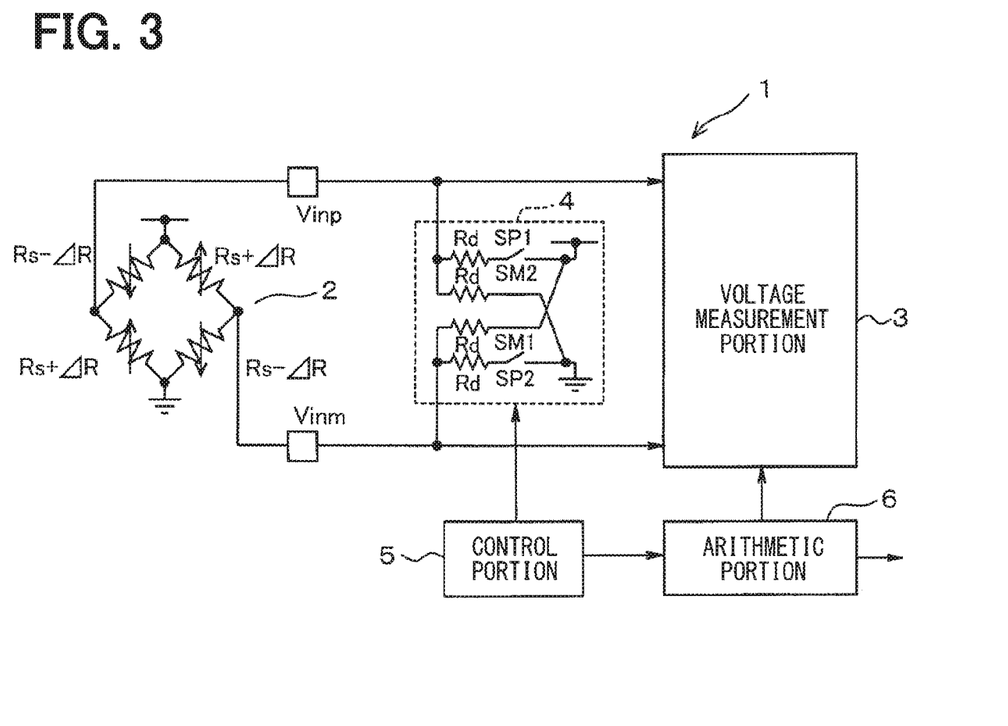

Then, in a phase (C), the controller 5 turns off the switch circuits SP1 and SP2 of the temperature detection circuit 4 and turns on the switch circuits SM1 and SM2 of the temperature detection circuit 4 to produce a state illustrated in FIG. 3. Then, similarly, the controller 5 causes the voltage measurement portion 3 to measure a differential voltage for obtaining temperature information of the pressure sensor 2. In this case, the first path and the second path are switched in such a manner that the second path is formed on the output terminal Vinp side and the first path is formed on the output terminal Vinm side. A voltage measured in this state is denoted by a temperature M (Vinp−Vinm), which is expressed by expression (3).

Temperature $M(Vinp - Vinm) =$ Expression 3

$$\frac{1}{Rs - \triangle R + \frac{(Rs + \triangle R)Rd}{Rs + \triangle R + Rd}} * \frac{(Rs + \triangle R)Rd}{Rs + \triangle R + Rd} Vdd -$$

$$\frac{Rs - \triangle R}{Rs - \triangle R + \frac{(Rs + \triangle R)Rd}{Rs + \triangle R + Rd}} Vdd$$

When the two voltages (the temperature P and the temperature M) are measured in this manner, the calculator 6 calculates a difference therebetween to obtain temperature information of the pressure sensor 2. However, the temperature information is obtained on the condition that a resistance value of the resistor element Rs of the pressure sensor 2 is sufficiently larger than a resistance value ΔR which changes according to pressure.

Temperature $P -$ Temperature $M =$ Expression 4

$$\frac{2(Rs + \triangle R)(Rs - \triangle R)}{Rs^2 + 2RdRs - \triangle R^2} Vdd \approx$$

$$\frac{2Rs}{Rs + 2Rd} Vdd ( \because Rs \gg \triangle R)$$

In expression (4), the resistance value ΔR is not included. Thus, the voltage (the temperature P−the temperature M) does not include information of the pressure detected by the pressure sensor 2 and reflects the temperature characteristic of the pressure sensor 2. The pressure detected by the pressure sensor 2 can be corrected according to the temperature characteristic by acquiring the temperature information of the pressure sensor 2 in this manner.

As illustrated in FIG. 4, the sensor apparatus 1 sequentially and repeatedly executes the phases (A), (B), and (C). In the next period, the calculator 6 calculates a difference between the temperature P and the temperature M measured in the previous period to obtain the voltage (the temperature P−the temperature M). An operation for correcting the pressure may be performed as needed.

An error [%] between an operation result in expression (4) and an approximate expression to which a condition (Rs>>ΔR) is applied is expressed by expression (5).

Error relative to approximate expression $[\%] = 100 -$ Expression 5

$$\left(\frac{2(Rs + \triangle R)(Rs - \triangle R)}{Rs^2 + 2RdRs - \triangle R^2} Vdd\right) \bigg/ \left(\frac{2Rs}{Rs + 2Rd} Vdd\right) * 100$$

Figure 5:
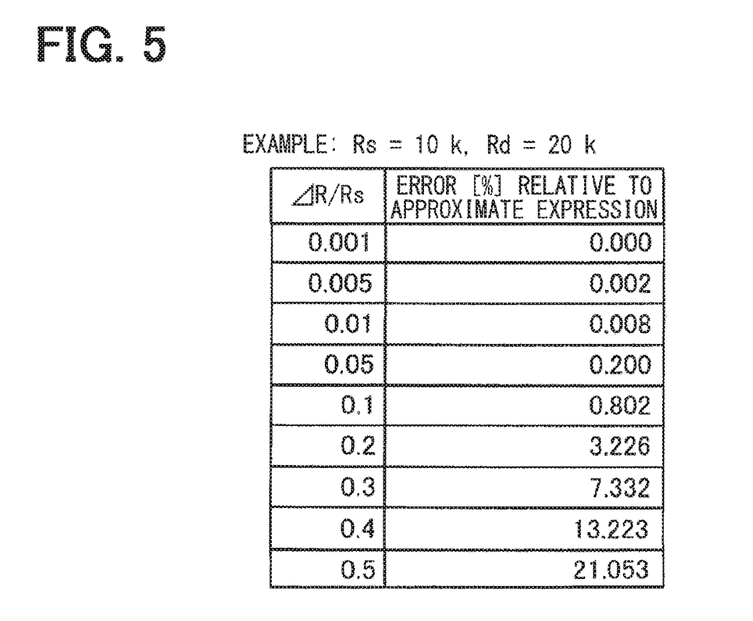
FIG. 5 is a diagram illustrating an error relative to an approximate expression according to a resistance ratio (ΔR/Rs)
Figure 6:
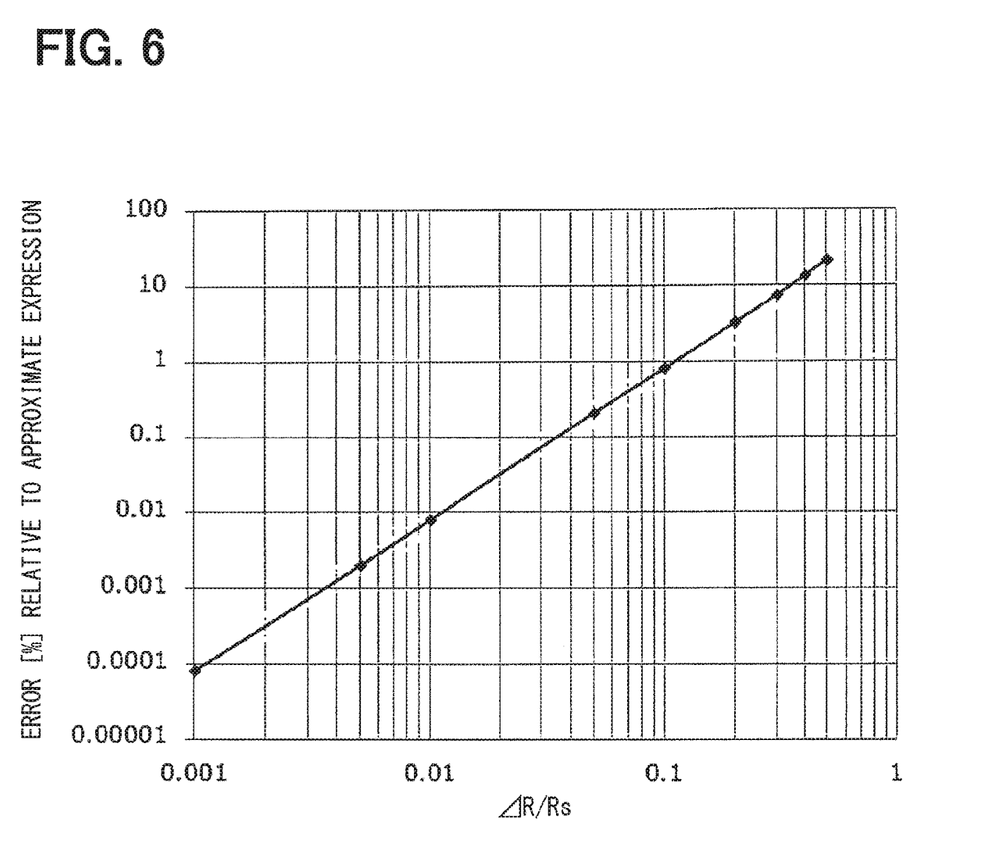
FIG. 6 is a graph with a horizontal axis representing a logarithm of the resistance ratio (ΔR/Rs) and a vertical axis representing the error.

For example, when Rs=10 kΩ and Rd=20 kΩ, the error relative to the approximate expression according to a resistance ratio (ΔR/Rs) is as illustrated in FIGS. 5 and 6. Thus, the resistance ratio (ΔR/Rs) may be appropriately set within a range in which an error is allowed.

As described above, according to the present embodiment, the temperature detection circuit 4 is configured to form the first path for supplying a current to one of the positive-side and negative-side differential output terminals Vinp and Vinm of the pressure sensor 2 which includes the resistor bridge circuit and the second path for draining a current from the other differential output terminal, the first path and the second path being switchable with respect to the two differential output terminals Vinp and Vinm.

The controller 5 causes the voltage measurement portion 3 to measure the voltage of each of the two differential output terminals Vinp and Vinm for a case where the first path is formed in one of the differential output terminals and the second path is formed in the other differential output terminal by the temperature detection circuit 4 and for a case where the second path is formed in the one differential output terminal and the first path is formed in the other differential output terminal by the temperature detection circuit 4. The calculator 6 calculates the difference between the voltages of the differential output terminals Vinp and Vinm to acquire temperature information of the pressure sensor 2. Such a configuration makes it possible to eliminate the necessity of a constant current source and acquire temperature information of the pressure sensor 2 with the S/N ratio maintained without lowering the sensor sensitivity as in a related art.

Specifically, the temperature detection circuit 4 includes the first series circuit that is connected between the differential output terminal Vinp and the power source and includes the resistor element Rd and the switch circuit SP1, the second series circuit which is connected between the differential output terminal Vinm and the power source and includes the resistor element Rd and the switch circuit SM1, the third series circuit which is connected between the differential output terminal Vinp and the ground and includes the resistor element Rd and the switch circuit SM2, and the fourth series circuit which is connected between the differential output terminal Vinm and the ground and includes the resistor element Rd and the switch circuit SP2. With such a configuration, it is possible to form the first path in the positive-side differential output terminal Vinp and form the second path in the negative-side differential output terminal Vinm by simultaneously turning on only the switch circuits SP1 and SP2. Further, it is possible to form the first path and the second path with the positive and negative sides switched by simultaneously turning on only the switch circuits SM1 and SM2.

Second Embodiment

Figure 7:
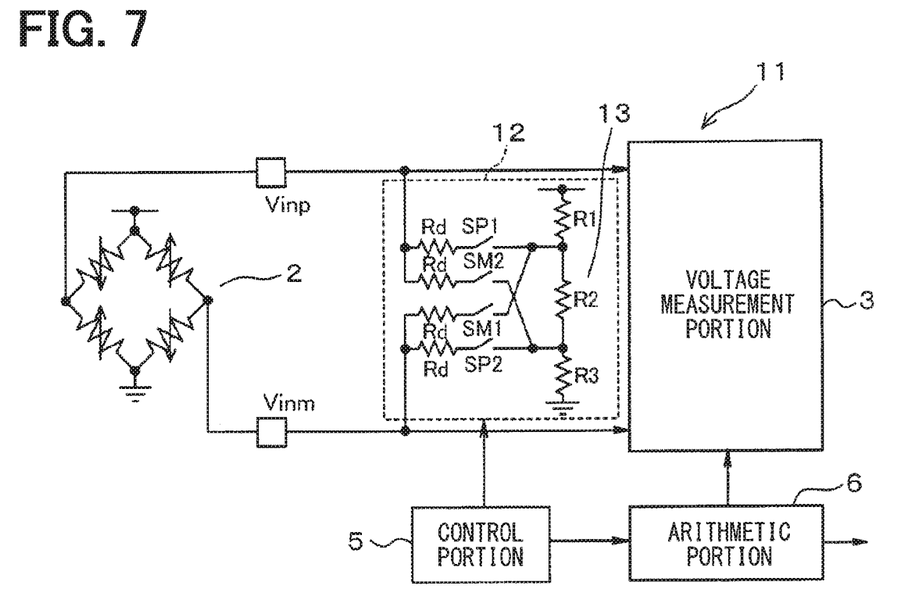
FIG. 7 is a diagram illustrating the configuration of a sensor apparatus in a second embodiment.

Hereinbelow, the same part as the first embodiment is designated by the same reference sign, and description thereof will be omitted. Thus, a different part from the first embodiment will be described. As illustrated in FIG. 7, in a sensor apparatus 11 of the second embodiment, a temperature detection circuit 12 includes a series circuit 13 of resistor elements R1 to R3. The series circuit 13 is connected between a power source and ground. A common connection point between switch circuits SP1 and SM1 is connected to a common connection point between the resistor elements R1 and R2. A common connection point between switch circuits SP2 and SM2 is connected to a common connection point between the resistor elements R2 and R3. The resistor elements R1 to R3 correspond to first to third resistor elements, respectively. The series circuit 13 corresponds to a voltage dividing resistor circuit.

In the above configuration, a voltage amplitude in temperature detection can be variably set by adjusting resistance values of the resistor elements R1 to R3. Each of the switch circuits SP and SM is often composed of a MOSFET. In this case, a potential difference with respect to the power source or the ground is given to both ends of the switch circuits SP and SM. Accordingly, a threshold of the FET increases by a substrate effect, and an off-leak current can be reduced. The "off-leak" described herein refers to, for example, off-leak on the switch circuit SM side which is OFF when the switch circuit SP side is ON as illustrated in FIG. 2.

Third Embodiment

Figure 8:
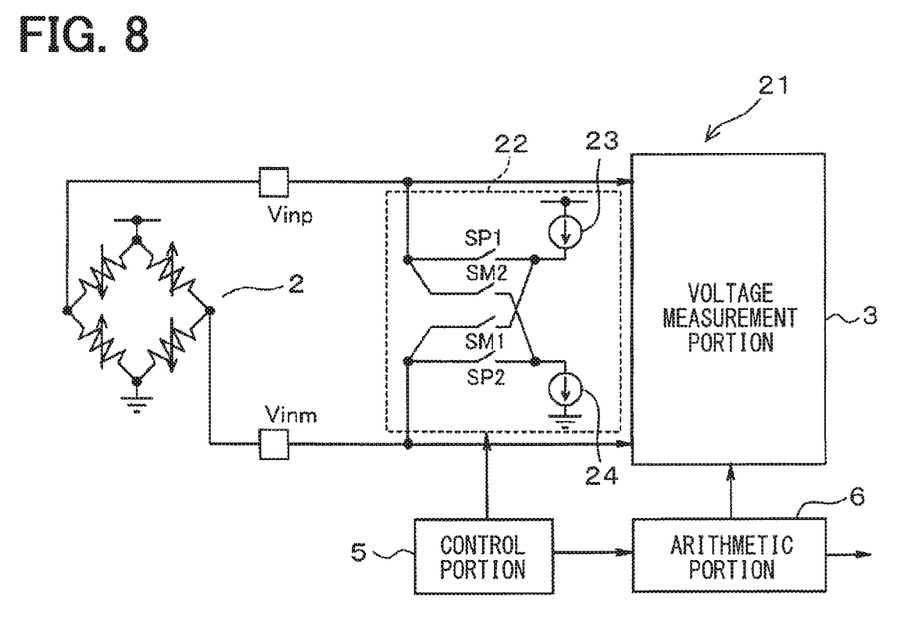
FIG. 8 is a diagram illustrating the configuration of a sensor apparatus in a third embodiment.

As illustrated in FIG. 8, a temperature detection circuit 22 of a sensor apparatus 21 of a third embodiment includes a first constant current source 23 and a second constant current source 24 instead of the resistor elements Rd of the temperature detection circuit 4 of the first embodiment. One end of the first constant current source 23 is connected to a power source. One end of the second constant current source 24 is connected to ground. A common connection point between switch circuits SP1 and SM1 is connected to the other end of the first constant current source 23. A common connection point between switch circuits SP2 and SM2 is connected to the other end of the second constant current source 24.

According to the third embodiment configured in the above manner, an effect similar to the effect of the first embodiment can be obtained. The constant current sources 23 and 24 of the third embodiment are connected in parallel to the pressure sensor 2. Thus, a voltage applied to the pressure sensor 2 is not reduced as in a related art.

Fourth Embodiment

Figure 9:
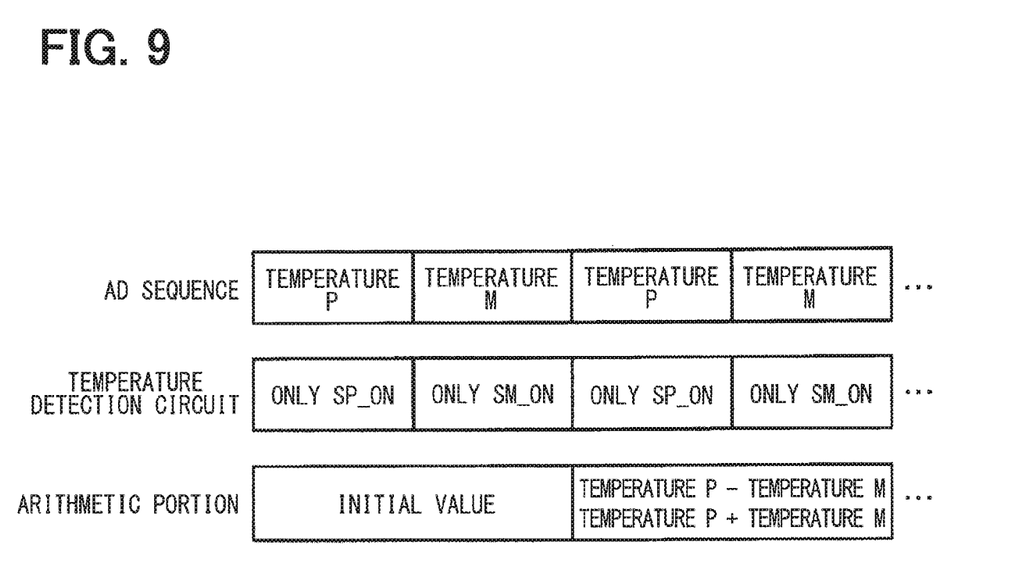
FIG. 9 is a diagram illustrating a control sequence of a sensor apparatus in a fourth embodiment.

As illustrated in FIG. 9, in the fourth embodiment, the temperature P and the temperature M, which are measured to acquire temperature information in the above embodiments, are added to also acquire information of a pressure detected by a pressure sensor 2. When a condition (Rd=Rs/2) is set, and (the temperature P+the temperature M) is calculated, a result similar to the result of expression (1) is obtained.

$$\text{Temperature } P + \text{Temperature } M = \frac{4Rd\triangle R}{Rs^2 - \triangle R^2 + 2RdRs}Vdd \approx$$

$$\frac{4\triangle R}{Rs\left(\frac{Rs}{Rd}+2\right)}Vdd(\because Rd >> \triangle R) =$$

$$\frac{\triangle R}{Rs}Vdd(\because Rd = Rs/2)$$

Expression 6

Further, expression (6) also corresponds to a pressure sensitivity of a sensor apparatus 1. The temperature sensitivity is obtained by expression (7).

$$\text{Temperature sensitivity} = \frac{d(\text{Temperature } P - \text{Temperature } M)}{dRs} = \frac{d\left(\frac{2Rs}{Rs+2Rd}Vdd\right)}{dRs} = \frac{4Rd}{(Rs+2Rd)^2}Vdd$$

Expression 7

Figure 10:
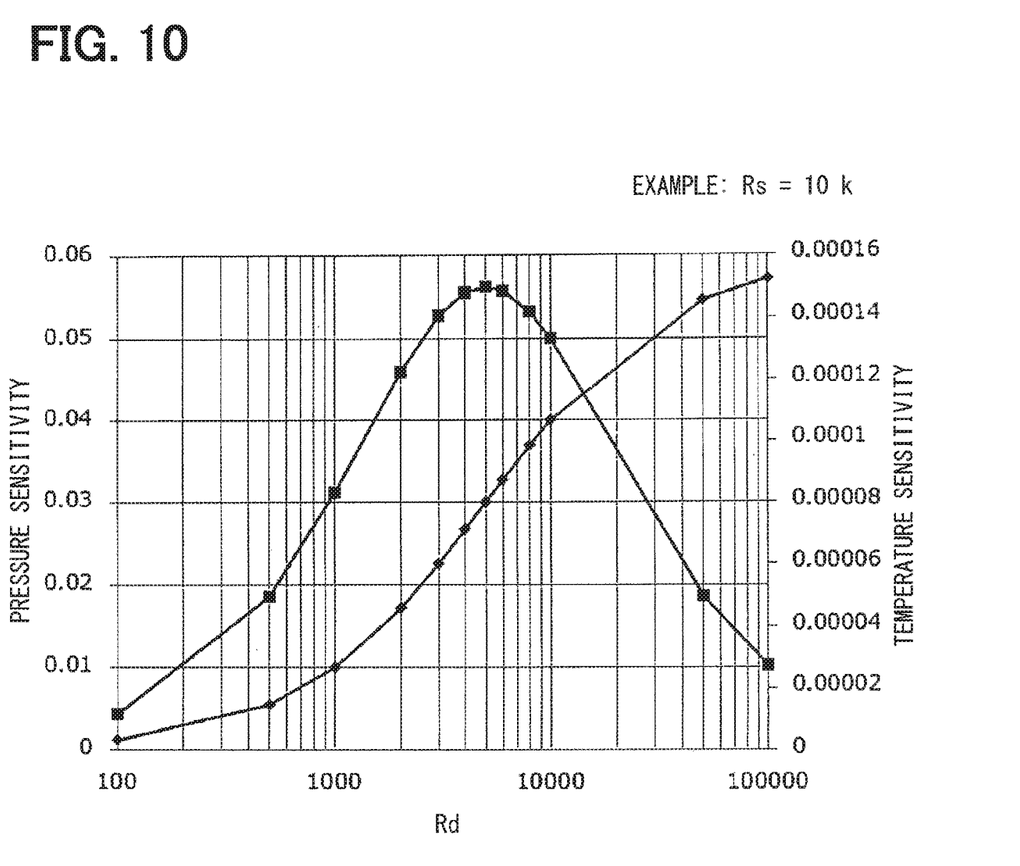
FIG. 10 is a graph illustrating results obtained by calculating Expression 6 and Expression 7 where Rs=10 kΩ by changing a resistance value of a resistor element Rd of a temperature detection circuit.

When the expression (6) and the expression (7) where Rs=10 kΩ are calculated by changing a resistance value of a resistor element Rd of a temperature detection circuit 4, results shown in FIG. 10 are obtained. The results show that the temperature sensitivity is maximum when the condition (Rd=Rs/2) is satisfied.

As described, according to the fourth embodiment, a calculator 6 acquires information of a pressure detected by the pressure sensor 2 by adding the temperature P and the temperature M. Thus, it is possible to reduce the time required for a control sequence. Further, it is possible to maximize the temperature sensitivity by setting the resistance value of the resistor element Rd to half a resistance value of a resistor element Rs of the pressure sensor 2.

Fifth Embodiment

Figure 11:
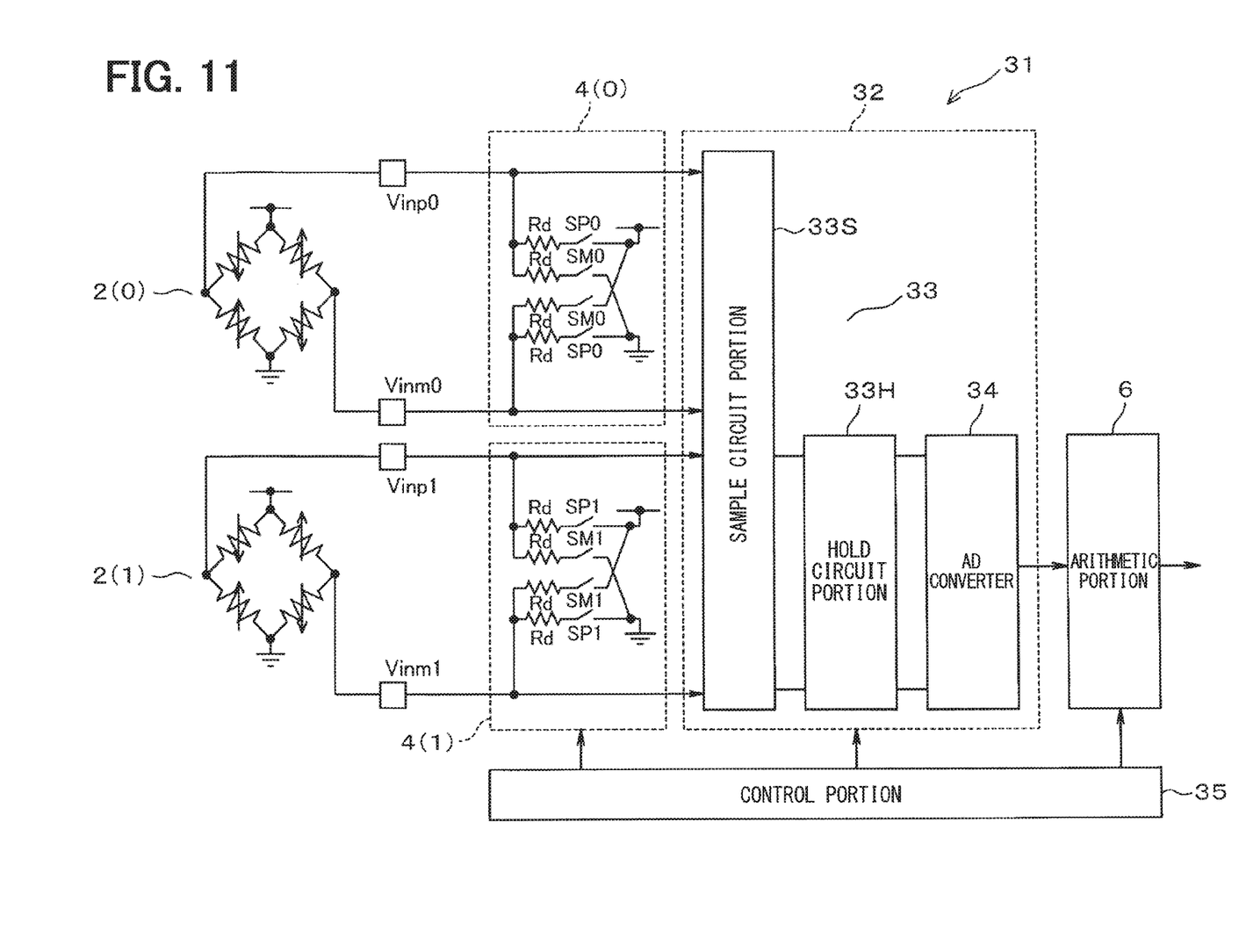
FIG. 11 is a diagram illustrating the configuration of a sensor apparatus in a fifth embodiment.

As illustrated in FIG. 11, a sensor apparatus 31 of a fifth embodiment includes two pairs of pressure sensors 2 and temperature detection circuits 4. One of the pairs includes a pressure sensor 2 (0) and a temperature detection circuit 4 (0), and the other pair includes a pressure sensor 2 (1) and a temperature detection circuit 4 (1). A voltage measurement portion 32 includes a sample hold circuit 33 which is built therein and includes a sample circuit portion 33S and a hold circuit portion 33H.

Figure 12:
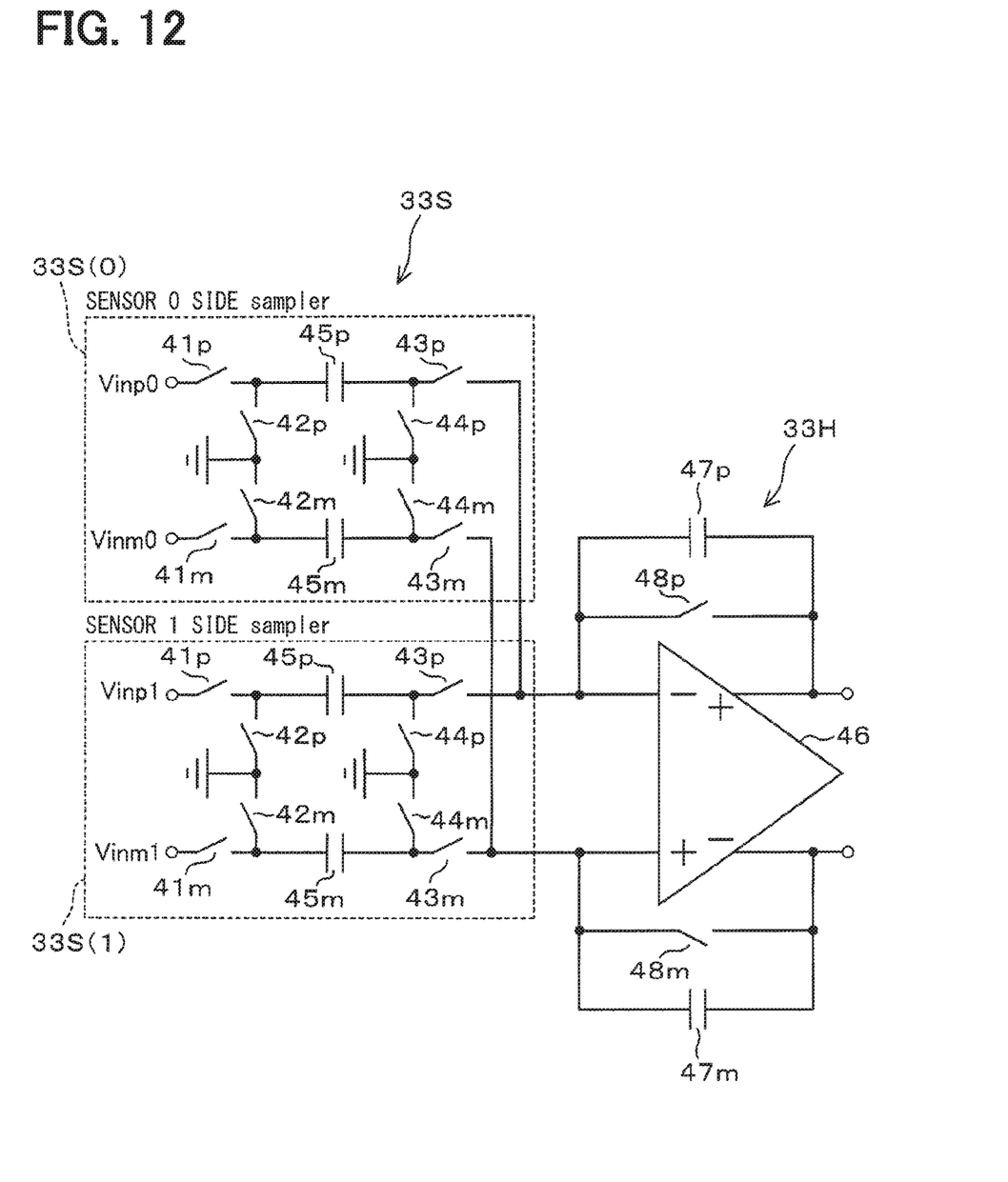
FIG. 12 is a diagram illustrating a sample hold circuit.

As illustrated in FIG. 12, the sample hold circuit 33 includes sample circuit portions 33S (0) and 33S (1) which correspond to pressure sensors 2 (0) and 2 (1), respectively. The sample circuit portion 33S includes switch circuits 41*p* and 41*m* as well as 42*p* and 42*m* of the input side, and 43*p* and 43*m* as well as 44*p* and 44*m* of the output side. A common connection point between the switch circuits 42*p* and 42*m* and a common connection point between the switch circuits 44*p* and 44*m* are both connected to ground. Capacitors 45*p* and 45*m* for sampling are connected between the switch circuits 41*p* and 43*p* and between the switch circuits 41*m* and 43*m*, respectively.

The hold circuit portion 33H includes a differential amplifier 46. A parallel circuit of a capacitor 47*p* for holding and a switch circuit 48*p* is connected between an inverting input terminal and a noninverting output terminal of the differential amplifier 46. A parallel circuit of a capacitor 47*m* and a switch circuit 48*m* is connected between a noninverting input terminal and an inverting output terminal of the differential amplifier 46. The switch circuits 43*p* and 43*m* are connected to the inverting input terminal and the noninverting input terminal of the differential amplifier 46, respectively.

A controller 35 illustrated in FIG. 11 also controls ON/OFF of each of the switch circuits of the sample hold circuit 33. A voltage signal held by the sample hold circuit 33 is input to an A/D converter 34, converted to digital data, and input to a calculator 6.

Figure 13:
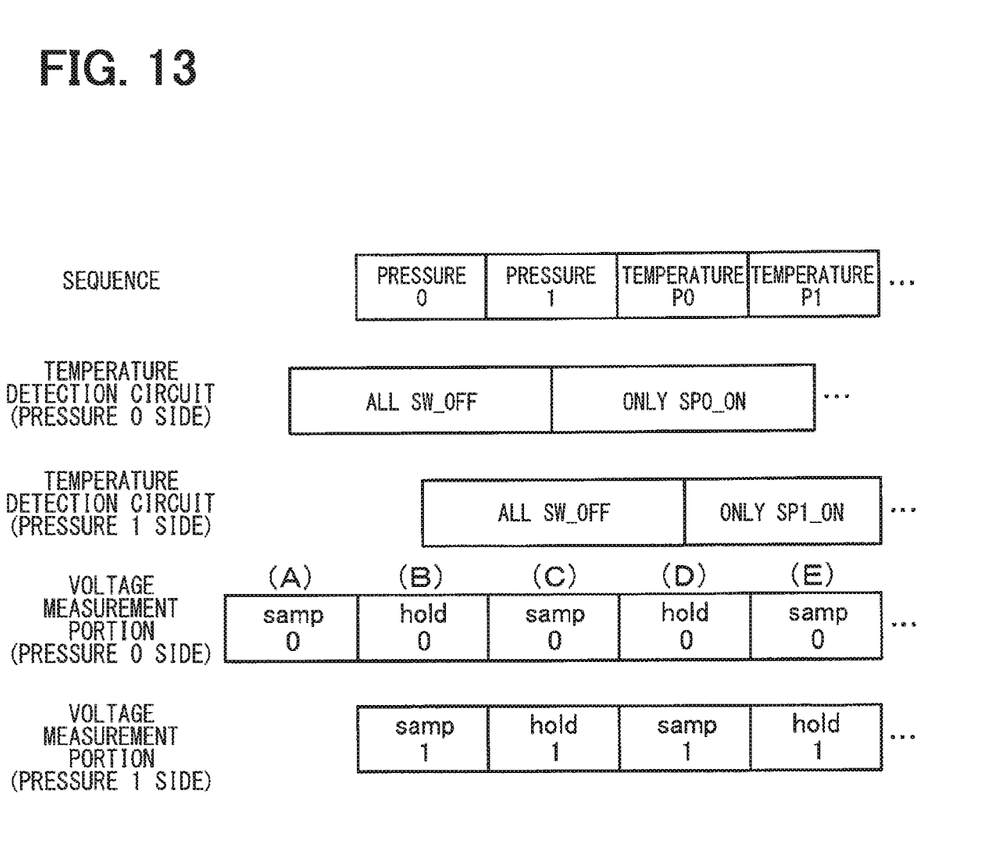
FIG. 13 is a diagram illustrating a control sequence of the sensor apparatus.

Next, an action of the fifth embodiment will be described. As an operation of the sample hold circuit 33 is a common operation, detailed description thereof will be omitted. As illustrated in FIG. 13, in a control sequence of the fifth embodiment, measurement of a pressure (0) of the pressure sensor 2 (0), measurement of a pressure (1) of the pressure sensor 2 (1), measurement of a temperature P (0), measurement of a temperature P (1), measurement of a temperature M (0), and measurement of a temperature M (1) are repeatedly executed.

In a first phase (A), the voltage measurement portion 32 samples a measurement result of the pressure (0) of the pressure sensor 2 (0). In the next phase (B), the voltage measurement portion 32 samples a measurement result of the pressure (1) of the pressure sensor 2 (1) in parallel with holding the measurement result of the pressure (0) of the pressure sensor 2 (0). In the next phase (C), the voltage measurement portion 32 holds the measurement result of the pressure (1) of the pressure sensor 2 (1) in parallel with sampling a measurement result of the pressure (0) of the pressure sensor 2 (0). The controller 35 switches each of the switch circuits of the temperature detection circuits 4 (0) and 4 (1) corresponding to the control sequence.

As described above, according to the fifth embodiment, in the configuration that includes the two pairs of pressure sensors 2 and temperature detection circuits 4, and samples and holds each measurement result by the voltage measurement portion 32, the control sequence can be shortened by performing sampling of a measurement result in one of the pairs in parallel with holding of a measurement result in the other pair.

Sixth Embodiment

Figure 14:
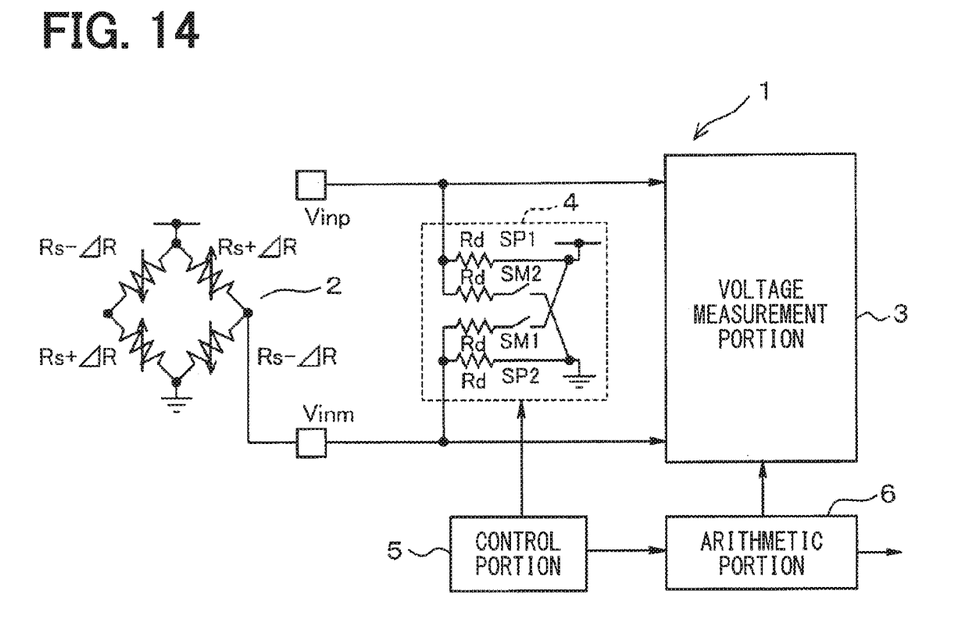
FIG. 14 is a diagram illustrating a state in which switch circuits SP1 and SP2 of a temperature detection circuit are ON when there is a break on a differential output terminal Vinp side in a sensor apparatus in a sixth embodiment.
Figure 15:
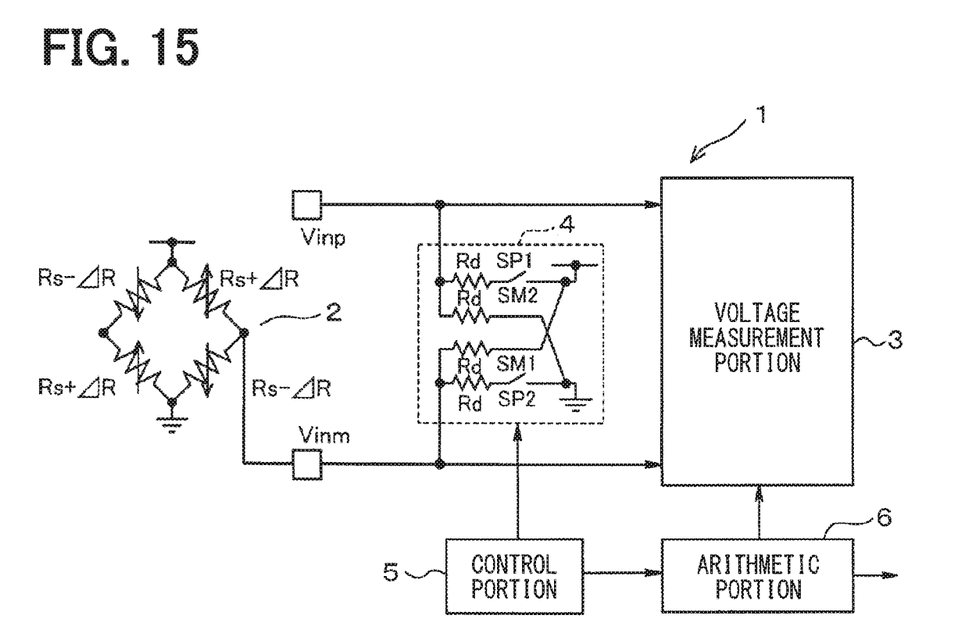
FIG. 15 is a diagram illustrating a state in which switch circuits SM1 and SM 2 are ON when there is a break on the differential output terminal Vinp side.

In a sixth embodiment, the occurrence of a break between one of the differential output terminals Vinp and Vinm of the pressure sensor 2 and the voltage measurement portion 3, for example, in the configuration of the first embodiment is detected. As illustrated in FIGS. 14 and 15, when there is a break on the differential output terminal Vinp side, a temperature P and a temperature M are measured, and a difference therebetween is calculated in a manner similar to the first embodiment. A result of the calculation is as expressed by expressions (8) to (10).

Temperature $P(Vinp - Vinm) = Vdd -$ Expression 8

$$\frac{1}{Rs + \triangle R + \frac{(Rs - \triangle R)Rd}{Rs - \triangle R + Rd}} * \frac{(Rs - \triangle R)Rd}{Rs - \triangle R + Rd} Vdd$$

Temperature $M(Vinp - Vinm) =$ Expression 9

$$GND - \frac{Rs - \triangle R}{Rs - \triangle R + \frac{(Rs + \triangle R)Rd}{Rs + \triangle R + Rd}} Vdd$$

Temperature $P +$ Temperature $M =$ Expression 10

$$\frac{2(Rs^2 + RdRs - \triangle R^2)}{Rs^2 + 2RdRs - \triangle R^2} Vdd \approx$$

$$\frac{2\left(\frac{Rd}{Rs} + 1\right)}{2\frac{Rd}{Rs} + 1} Vdd (\because Rs >> \triangle R) =$$

$$1.5 Vdd (\because Rd = Rs/2)$$

A result of expression (10) is 1.5 Vdd under the condition (Rd=Rs/2). That is, an extremely high voltage is detected. Thus, a break can be detected by setting an appropriate threshold and detecting the occurrence of the excessively high voltage.

Figure 16:
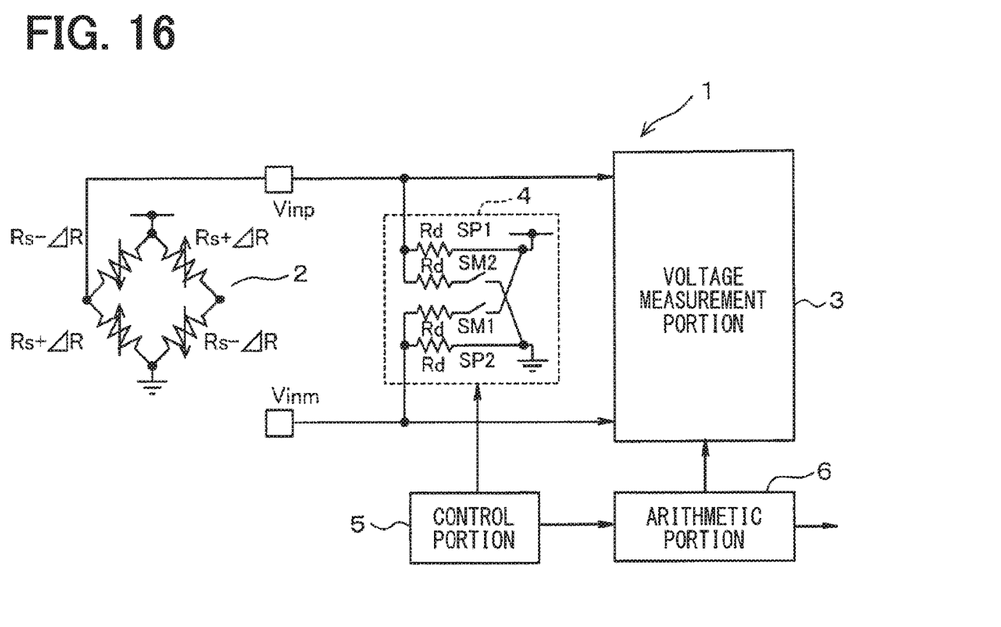
FIG. 16 is a diagram illustrating a state in which the switch circuits SP1 and SP2 of the temperature detection circuit are ON when there is a break on a differential output terminal Vinm side.
Figure 17:
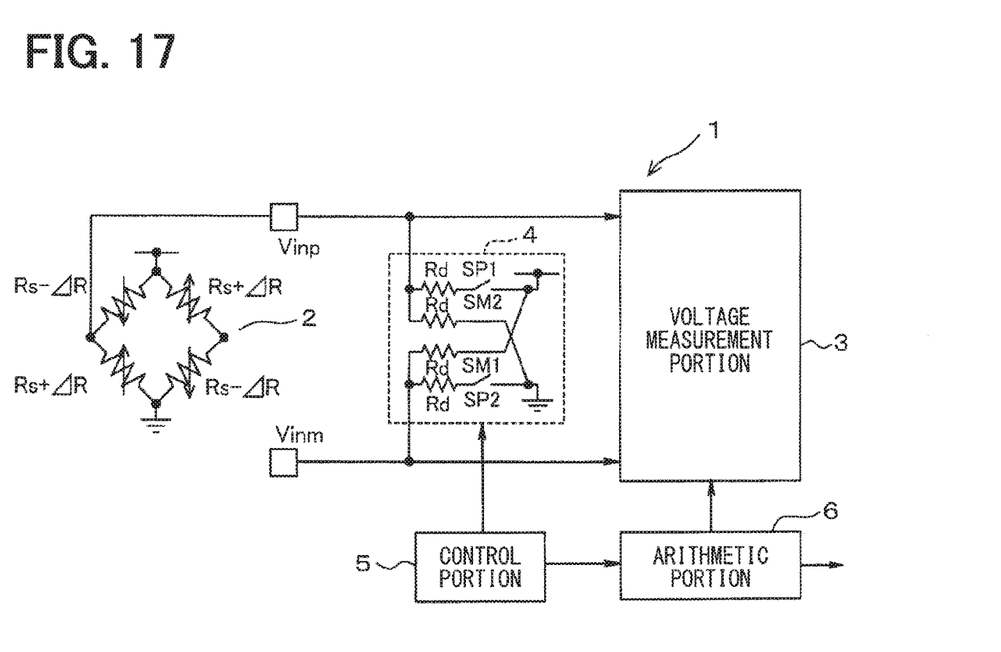
FIG. 17 is a diagram illustrating a state in which the switch circuits SM1 and SM2 are ON when there is a break on a differential output terminal Vinm side.

FIGS. 16 and 17 illustrate a case where there is a break on the differential output terminal Vinm side. A temperature P and a temperature M are measured, and a difference therebetween is calculated in a manner similar to the case where there is a break on the differential output terminal Vinp side. A result of the calculation is as expressed by expressions (11) to (13).

Temperature $P(Vinp - Vinm) =$ Expression 11

$$\frac{Rs + \triangle R}{Rs + \triangle R + \frac{(Rs - \triangle R)Rd}{Rs - \triangle R + Rd}} Vdd$$

-continued

Temperature $M(Vinp - Vinm) =$ Expression 12

$$\frac{1}{Rs - \triangle R + \frac{(Rs + \triangle R)Rd}{Rs + \triangle R + Rd}} * \frac{(Rs + \triangle R)Rd}{Rs + \triangle R + Rd} Vdd - Vdd$$

Temperature $P$ + Temperature $M =$ Expression 13

$$\frac{2(Rs^2 + RdRs - \triangle R^2)}{Rs^2 + 2RdRs - \triangle R^2} Vdd \approx$$

$$\frac{2\left(\frac{Rd}{Rs} + 1\right)}{2\frac{Rd}{Rs} + 1} Vdd (\because Rs >> \triangle R) =$$

$$1.5 Vdd (\because Rd = Rs/2)$$

A result of the expression (13) is also 1.5 Vdd under the condition (Rd=Rs/2). Thus, also in this case, a break can be detected in a similar manner.

As described above, according to the sixth embodiment, a calculator 6 is capable of detecting a break in the differential output terminal of the pressure sensor 2 by recognizing that the difference between the two voltages (the temperature P and the temperature M) exceeds an upper limit value.

Other Embodiments

The sensor is not limited to the pressure sensor, and may be any sensor that includes a resistor bridge circuit.

In the fifth embodiment, three or more pairs of pressure sensors 2 and temperature detection circuits 4 may be provided.

The embodiments may be implemented in an appropriately combined manner.

Aspects of the disclosure described herein are set forth in the following clauses.

Figure 18:
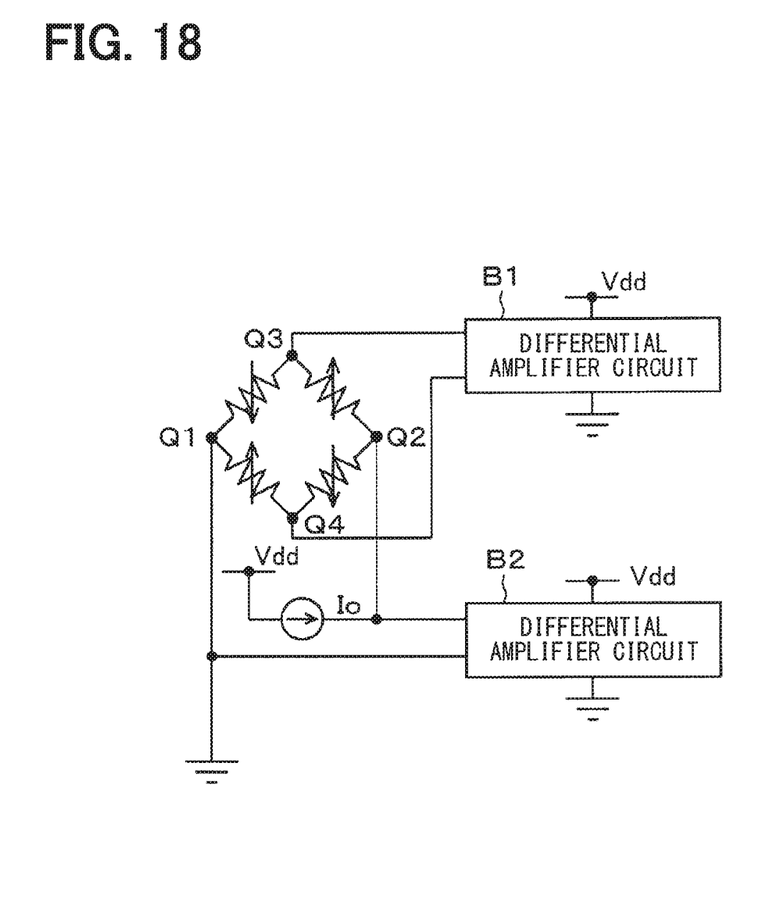
FIG. 18 is a diagram illustrating a comparative example.

It is considered that the constant current source is connected in series between a power source and the resistor bridge circuit in actuality, as illustrated in FIG. 18. The actual circuit needs to be operated between the power source and ground. Thus, when the direction of current is taken into consideration, the configuration should be as illustrated in FIG. 18 inevitably. Accordingly, a voltage applied to the resistor bridge circuit is reduced by an amount of a voltage drop in the constant current source. As a result, there arises a difficulty of deterioration of an S/N ratio caused by a reduction in sensor sensitivity.

It is an object of the present disclosure to provide a sensor apparatus capable of acquiring temperature information without lowering the sensor sensitivity.

According to one aspect of the present disclosure, a temperature detection circuit is configured to form a first path for supplying a current to one of positive-side and negative-side differential output terminals of a sensor that includes a resistor bridge circuit and a second path for draining a current from the other differential output terminal, the first path and the second path being switchable with respect to the two differential output terminals. A controller causes a voltage measurement portion to measure a voltage of each of the two differential output terminals for a case where the first path is formed in one of the differential output terminals and the second path is formed in the other differential output terminal by the temperature detection circuit and for a case where the second path is formed in the one differential output terminal and the first path is formed in the other differential output terminal by the temperature detection circuit. A calculator calculates a difference between the voltages of the two differential output terminals to acquire temperature information of the sensor. Such a configuration makes it possible to acquire temperature information of the sensor with the S/N ratio maintained without lowering the sensor sensitivity as in a related art.

According to one aspect of the present disclosure, the temperature detection circuit includes: a first series circuit connected between the positive-side differential output terminal and the power source and including a resistor element and a switch circuit; a second series circuit connected between the negative-side differential output terminal and the power source and including a resistor element and a switch circuit; a third series circuit connected between the positive-side differential output terminal and the ground and including a resistor element and a switch circuit; and a fourth series circuit connected between the negative-side differential output terminal and the ground and including a resistor element and a switch circuit. With such a configuration, it is possible to form the first path in one of the differential output terminals and form the second path in the other differential output terminal by simultaneously turning on only the switch circuits of the first and fourth series circuits. Further, it is possible to form the first path and the second path with the one differential output terminal and the other differential output terminal switched by simultaneously turning on only the switch circuits of the second and third series circuits.

While the present disclosure has been described based on the embodiments, it is to be understood that the present disclosure is not limited to the described embodiments and structures. The present disclosure also includes various modifications and modifications within the equivalent range thereof. In addition, various combinations or modes, and other combinations or modes including only one element, more, or less thereof are also included in the scope and idea range of the present disclosure.

The invention claimed is:
1. A sensor apparatus comprising:
a sensor that includes a resistor bridge circuit connected between a power source and ground, and detects a physical quantity;
a temperature detection circuit that provides
a first path for supplying a current to one of a positive-side differential output terminal and a negative-side differential output terminal of the resistor bridge circuit and
a second path for draining a current from another of the positive-side differential output terminal and the negative-side differential output terminal, the first path and the second path being switchable with respect to the positive-side differential output terminal and the negative-side differential output terminal;
a voltage measurement portion that measures a voltage of each of the differential output terminals;
a controller that causes the voltage measurement portion to measure the voltage of each of the differential output terminals for a case where the first path is provided in one of the differential output terminals and the second path is provided in a different one of the differential output terminals by the temperature detection circuit and for a case where the second path is provided in the one of the differential output terminals and the first path is provided in the different one of the differential output terminals by the temperature detection circuit; and a calculator that calculates a difference between voltages of the differential output terminals to acquire temperature information of the sensor.

2. The sensor apparatus according to claim 1, wherein:

the temperature detection circuit includes:
- a first series circuit connected between the positive-side differential output terminal and the power source and including a first resistor element and a first switch circuit;
- a second series circuit connected between the negative-side differential output terminal and the power source and including a second resistor element and a second switch circuit;
- a third series circuit connected between the positive-side differential output terminal and the ground and including a third resistor element and a third switch circuit; and
- a fourth series circuit connected between the negative-side differential output terminal and the ground and including a fourth resistor element and a fourth switch circuit.

3. The sensor apparatus according to claim 2, wherein:

the temperature detection circuit includes a voltage dividing resistor circuit connected between the power source and the ground and including a first resistor element, a second resistor element, and a third resistor element;

the first series circuit and the second series circuit are connected to the power source through the first resistor element; and the third series circuit and the fourth series circuit are connected to the ground through the third resistor element.

4. The sensor apparatus according to claim 2, wherein:

a resistance value of the resistor elements of the temperature detection circuit is half a resistance value of a resistor element of the resistor bridge circuit.

5. The sensor apparatus according to claim 1, wherein:

the temperature detection circuit includes:
- a first constant current source having one end connected to the power source;
- a second constant current source having one end connected to the ground;
- a first switch circuit connected between the positive-side differential output terminal and a different end of the first constant current source;
- a second switch circuit connected between the negative-side differential output terminal and a different end of the first constant current source;
- a third switch circuit connected between the positive-side differential output terminal and a different end of the second constant current source; and
- a fourth switch circuit connected between the negative-side differential output terminal and a different end of the second constant current source.

6. The sensor apparatus according to claim 1, wherein:

the calculator adds two target voltages for calculating the difference between voltages of the differential output terminals to acquire voltage data according to a pressure detected by the sensor.

7. The sensor apparatus according to claim 1, wherein:

the calculator detects a break in the differential output terminal when the difference between voltages of the differential output terminals exceeds an upper limit value.

8. A sensor apparatus comprising:
- a sensor that includes a resistor bridge circuit connected between a power source and ground, and detects a physical quantity;
- a temperature detection circuit that provides
  - a first path for supplying a current to one of a positive-side differential output terminal and a negative-side differential output terminal of the resistor bridge circuit and
  - a second path for draining a current from another of the positive-side differential output terminal and the negative-side differential output terminal, the first path and the second path being switchable with respect to the positive-side differential output terminal and the negative-side differential output terminal;
- a voltage measurement circuit that measures a voltage of each of the differential output terminals;
- a controller that is connected with the temperature detection circuit and causes the voltage measurement portion to measure the voltage of each of the differential output terminals for a case where the first path is provided in one of the differential output terminals and the second path is provided in a different one of the differential output terminals by the temperature detection circuit and for a case where the second path is provided in the one of the differential output terminals and the first path is provided in the different one of the differential output terminals by the temperature detection circuit; and
- a calculator that is connected with the controller and the voltage measurement circuit, and calculates a difference between voltages of the differential output terminals to acquire temperature information of the sensor.

* * * * *